(12) United States Patent
Hiyoshi et al.

(10) Patent No.: US 8,772,139 B2
(45) Date of Patent: Jul. 8, 2014

(54) METHOD OF MANUFACTURING SEMICONDUCTOR DEVICE

(75) Inventors: Toru Hiyoshi, Osaka (JP); Takeyoshi Masuda, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/577,836

(22) PCT Filed: Dec. 7, 2011

(86) PCT No.: PCT/JP2011/078278
§ 371 (c)(1),
(2), (4) Date: Aug. 8, 2012

(87) PCT Pub. No.: WO2012/093544
PCT Pub. Date: Jul. 12, 2012

(65) Prior Publication Data
US 2012/0309174 A1    Dec. 6, 2012

(30) Foreign Application Priority Data
Jan. 6, 2011  (JP) .................................. 2011-001205

(51) Int. Cl.
*H01L 21/20* (2006.01)
*H01L 21/36* (2006.01)

(52) U.S. Cl.
USPC ............. 438/483; 257/E21.09; 257/E21.182; 257/E21.541; 438/46; 438/285; 438/478; 438/586; 438/590; 438/779; 438/931

(58) Field of Classification Search
USPC ............. 257/E21.09, E21.182, E21.541, 478, 257/483, 586, 590, 779, 931; 438/46, 285
See application file for complete search history.

(56) References Cited

U.S. PATENT DOCUMENTS

2003/0201497 A1* 10/2003 Inoue et al. ................... 257/351
2006/0252212 A1* 11/2006 Harris et al. .................. 438/301
2008/0227256 A1*  9/2008 Tanimoto ...................... 438/285
2010/0255677 A1   10/2010 Miura

FOREIGN PATENT DOCUMENTS

| JP | 2001-094095 A |   | 4/2001  |
| JP | 2001-358153 A |   | 12/2001 |
| JP | 2002-043252 A |   | 2/2002  |
| JP | 2004-288890 A |   | 10/2004 |
| JP | 2006-324565 A |   | 11/2006 |
| JP | 2006324565    | * | 11/2006 |
| JP | 2010-245334 A |   | 10/2010 |

OTHER PUBLICATIONS

Ryu et al., "Critical Issues for MOS Based Power Devices in 4H-SiC," Materials Science Forum, vols. 615-617, pp. 743-748 (2009).

* cited by examiner

*Primary Examiner* — Asok K Sarkar
(74) *Attorney, Agent, or Firm* — Venable LLP; Michael A. Sartori; Tamatane J. Aga (57) ABSTRACT

A method of manufacturing a MOSFET includes the steps of preparing a silicon carbide substrate, forming an active layer on the silicon carbide substrate, forming a gate oxide film on the active layer, forming a gate electrode on the gate oxide film, forming a source contact electrode on the active layer, and forming a source interconnection on the source contact electrode. The step of forming the source interconnection includes the steps of forming a conductor film on the source contact electrode and processing the conductor film by etching the conductor film with reactive ion etching. Then, the method of manufacturing a MOSFET further includes the step of performing annealing of heating the silicon carbide substrate to a temperature not lower than 50° C. after the step of processing the conductor film.

4 Claims, 11 Drawing Sheets

METHOD OF MANUFACTURING SEMICONDUCTOR DEVICE

TECHNICAL FIELD

The present invention relates to a method of manufacturing a semiconductor device and more particularly to a method of manufacturing a semiconductor device capable of achieving a suppressed leakage current.

BACKGROUND ART

In recent years, in order to achieve a higher breakdown voltage and lower loss of a semiconductor device, use thereof in an environment at high temperature and the like, silicon carbide has increasingly been adopted as a material for forming a semiconductor device. Silicon carbide is a wide bandgap semiconductor greater in band gap than silicon conventionally widely used as a material for forming a semiconductor device. Therefore, by adopting silicon carbide as a material for forming a semiconductor device, a higher breakdown voltage, a lower ON resistance of a semiconductor device and the like can be achieved. In addition, a semiconductor device adopting silicon carbide as a material is also more advantageous than a semiconductor device adopting silicon as a material in that deterioration in its characteristics at the time when it is used in an environment at high temperature is less.

Among such semiconductor devices including silicon carbide as a material, with regard to such a semiconductor device as a MOSFET (Metal Oxide Semiconductor Field Effect Transistor) or an IGBT (Insulated Gate Bipolar Transistor) in which whether or not an inversion layer is formed in a channel region directly under a gate insulating film with a prescribed voltage serving as a threshold is controlled so that a current is allowed to flow or cut off, various studies on adjustment of a threshold voltage or improvement in channel mobility have been conducted (see, for example, Sei-Hyung Ryu et al., "Critical Issues for MOS Based Power Devices in 4H-SiC," Materials Science Forum, 2009, Vols. 615-617, p 743-748 (NPL 1)).

CITATION LIST

Non Patent Literature

NPL 1: Sei-Hyung Ryu et al., "Critical Issues for MOS Based Power Devices in 4H-SiC," Materials Science Forum, 2009, Vols. 615-617, p 743-748

SUMMARY OF INVENTION

Technical Problem

Here, in a semiconductor device in which whether or not an inversion layer is formed in the channel region above is controlled, a current passing through a gate insulating film (a leakage current) may be generated and an unintended current may flow.

The present invention was made to address such a problem, and an object thereof is to provide a method of manufacturing a semiconductor device capable of achieving a suppressed leakage current.

Solution to Problem

A method of manufacturing a semiconductor device according to the present invention includes the steps of preparing a substrate composed of silicon carbide, forming an active layer on the substrate, forming a gate insulating film on the active layer, forming a gate electrode on the gate insulating film, forming a contact electrode on the active layer, in contact with the active layer, and forming an interconnection on the contact electrode, in contact with the contact electrode. The step of forming an interconnection includes the steps of forming a conductor film on the contact electrode and processing the conductor film by etching the conductor film with reactive ion etching (RIE). Then, this method of manufacturing a semiconductor device further includes the step of performing annealing of heating the substrate to a temperature not lower than 50° C. after the step of processing the conductor film.

As a result of the present inventor's studies on a leakage current in a semiconductor device, the present inventor has found the following and arrived at the present invention. Namely, in a process for manufacturing a semiconductor device including silicon carbide as a source material, RIE is used in the step of forming a semiconductor layer, an insulating film, an electrode, and the like. Then, the present inventor has found that a leakage current is generated as RIE is performed. This may be because damages and the like are introduced in silicon carbide or in a gate insulating film as RIE is performed. Then, the studies conducted by the present inventor have clarified that a leakage current resulting from influence by RIE can be suppressed by performing annealing in a temperature range not lower than 50° C. after RIE is performed. Here, even in a case where ME is performed in a process for manufacturing a semiconductor device, heating to a temperature not lower than 50° C. after ME will suppress a leakage current resulting from the influence by the RIE. After an interconnection is formed in the process for manufacturing a semiconductor device, however, heating to a temperature not lower than 50° C. is not performed. Therefore, in a case where RIE is performed in forming an interconnection, unless annealing of heating to a temperature not lower than 50° C. is subsequently performed, a leakage current results from the influence by the RIE.

In the method of manufacturing a semiconductor device according to the present invention, ME is performed in the step of forming an interconnection and thereafter annealing of heating the substrate to a temperature not lower than 50° C. is performed. Therefore, a leakage current resulting from the influence by ME in the step of forming an interconnection is suppressed. Thus, according to the method of manufacturing a semiconductor device in the present invention, a method of manufacturing a semiconductor device capable of achieving a suppressed leakage current can be provided.

In order to more reliably suppress a leakage current, the temperature for annealing above is preferably not lower than 70° C. and further preferably not lower than 100° C.

In the method of manufacturing a semiconductor device above, in the step of performing annealing above, the substrate may be heated to a temperature not higher than 400° C.

When a temperature for annealing exceeds 400° C., an effect of suppression of a leakage current hardly improves. On the other hand, when an annealing temperature exceeds 400° C., an interconnection or the like formed previously may be damaged by annealing. Therefore, the annealing temperature may be not higher than 400° C. and may be not higher than 300° C.

In the method of manufacturing a semiconductor device above, preferably, reactive ion etching is not performed after the step of performing annealing. Thus, a new cause of generation of a leakage current can be suppressed.

In the method of manufacturing a semiconductor device above, the annealing above may be performed in an inert gas. From a point of view of reliable suppression of oxidation of a semiconductor device in annealing above, an inert gas is preferably adopted as an atmosphere.

Advantageous Effects of Invention

As is clear from the description above, according to the method of manufacturing a semiconductor device in the present invention, a method of manufacturing a semiconductor device capable of achieving a suppressed leakage current can be provided.

DESCRIPTION OF EMBODIMENTS

An embodiment of the present invention will be described hereinafter with reference to the drawings. In the drawings below, the same or corresponding elements have the same reference characters allotted and description thereof will not be repeated.

First Embodiment

Figure 1:
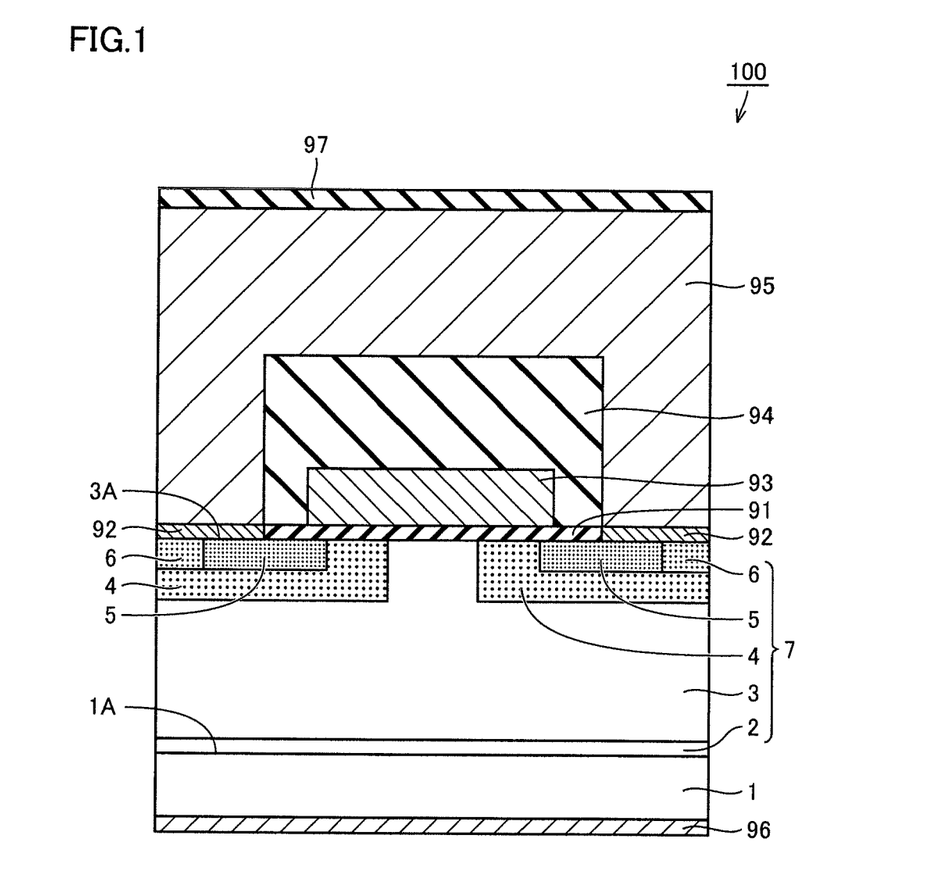
FIG. 1 is a schematic cross-sectional view showing a structure of a MOSFET in a first embodiment.

Initially, a first embodiment representing one embodiment of the present invention will be described. Referring to FIG. 1, a MOSFET 100 representing a semiconductor device in the present embodiment includes a silicon carbide substrate 1 having an n conductivity type, a buffer layer 2 composed of silicon carbide and having the n conductivity type, a drift layer 3 composed of silicon carbide and having the n conductivity type, a pair of p-type body regions 4 having a p conductivity type, an $n^+$ region 5 having the n conductivity type, and a $p^+$ region 6 having the p conductivity type.

Buffer layer 2 is formed on one main surface 1A of silicon carbide substrate 1 and has the n conductivity type by including an n-type impurity. Drift layer 3 is formed on buffer layer 2 and has the n conductivity type by including an n-type impurity. An n-type impurity included in drift layer 3 is, for example, N (nitrogen), and it is included at concentration (density) lower than that of an n-type impurity included in buffer layer 2. Buffer layer 2 and drift layer 3 are epitaxial growth layers formed on one main surface 1A of silicon carbide substrate 1.

The pair of p-type body regions 4 is formed separately from each other in drift layer 3 so as to include a main surface 3A opposite to the main surface on the side of silicon carbide substrate 1, and it has the p conductivity type by including a p-type impurity (an impurity having the p conductivity type). A p-type impurity included in p-type body region 4 is, for example, aluminum (Al), boron (B), or the like.

$N^+$ region 5 is formed in each of the pair of p-type body regions 4 so as to include main surface 3A above and to be surrounded by p-type body region 4. $N^+$ region 5 includes an n-type impurity such as P at concentration (density) higher than that of an n-type impurity included in drift layer 3. $P^+$ region 6 is formed in each of the pair of p-type body regions 4 so as to include main surface 3A above, to be surrounded by p-type body region 4, and to be adjacent to $n^+$ region 5. $P^+$ region 6 includes a p-type impurity such as Al at concentration (density) higher than that of a p-type impurity included in p-type body region 4. Buffer layer 2, drift layer 3, p-type body regions 4, $n^+$ region 5, and $p^+$ region 6 above form an active layer 7.

Referring further to FIG. 1, MOSFET 100 includes a gate oxide film 91 serving as a gate insulating film, a gate electrode 93, a pair of source contact electrodes 92, an interlayer insulating film 94, a source interconnection 95, a drain electrode 96, and a passivation film 97.

Gate oxide film 91 is formed on main surface 3A to be in contact with main surface 3A and to extend from an upper surface of one $n^+$ region 5 to an upper surface of the other $n^+$ region 5, and is composed, for example, of silicon dioxide ($SiO_2$).

Gate electrode 93 is arranged in contact with gate oxide film 91 so as to extend from one $n^+$ region 5 to the other $n^+$ region 5 over the same. In addition, gate electrode 93 is made of such a conductor as polysilicon to which an impurity has been added or Al.

Source contact electrode 92 is arranged to extend from each of the pair of $n^+$ regions 5 away from gate oxide film 91 toward $p^+$ region 6 and to be in contact with main surface 3A. In addition, source contact electrode 92 is made of a material capable of establishing ohmic contact with $n^+$ region 5, such as $Ni_xSi_y$ (nickel silicide).

Interlayer insulating film 94 is formed to surround gate electrode 93 on main surface 3A and to extend from one p-type body region 4 to the other p-type body region 4 over the same, and made, for example, of such an insulator as silicon dioxide ($SiO_2$).

Source interconnection 95 surrounds an upper surface and a side surface of interlayer insulating film 94 on main surface 3A and it extends to an upper surface of source contact electrode 92. In addition, source interconnection 95 is made of such a conductor as Al and electrically connected to $n^+$ region 5 through source contact electrode 92.

Drain electrode 96 is formed in contact with a main surface of silicon carbide substrate 1 opposite to a side where drift layer 3 is formed. This drain electrode 96 is made of a material capable of establishing ohmic contact with silicon carbide substrate 1 such as $Ni_xSi_y$, and electrically connected to silicon carbide substrate 1.

Passivation film 97 is formed to cover source interconnection 95 and made of such an insulator as silicon dioxide.

An operation of MOSFET 100 will now be described. Referring to FIG. 1, with a voltage of gate electrode 93 being lower than a threshold voltage, that is, in an OFF state, even when a voltage is applied to the drain electrode, a pn junction between p-type body region 4 and drift layer 3 located directly under gate oxide film 91 is reverse-biased and rendered non-conductive. On the other hand, when a voltage equal to or higher than a threshold voltage is applied to gate electrode 93, an inversion layer is formed in a channel region which is a portion around where p-type body region 4 comes in contact with gate oxide film 91. Consequently, $n^+$ region 5 and drift layer 3 are electrically connected to each other and a current flows between source interconnection 95 and drain electrode 96.

Here, when no measures are taken against use of RIE in the process for manufacturing MOSFET 100, a current passing through gate oxide film 91 (a leakage current) may be generated during the operation above and an unintended current may flow. MOSFET 100 in the present embodiment, however, is manufactured with the method of manufacturing a semiconductor device in the present embodiment which will be described below, and therefore a leakage current is suppressed.

Figure 2:
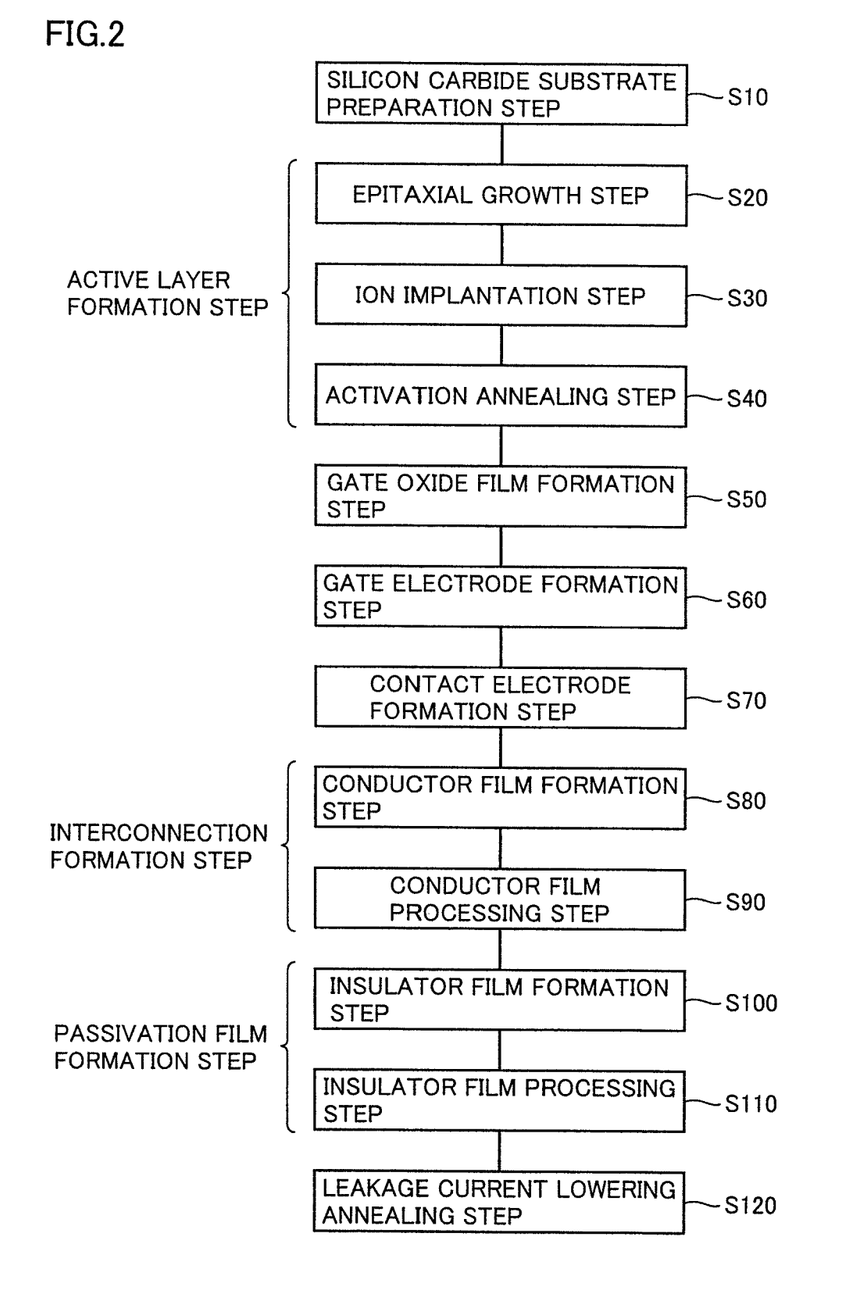
FIG. 2 is a flowchart showing outlines of a method of manufacturing a MOSFET in the first embodiment.
Figure 3:
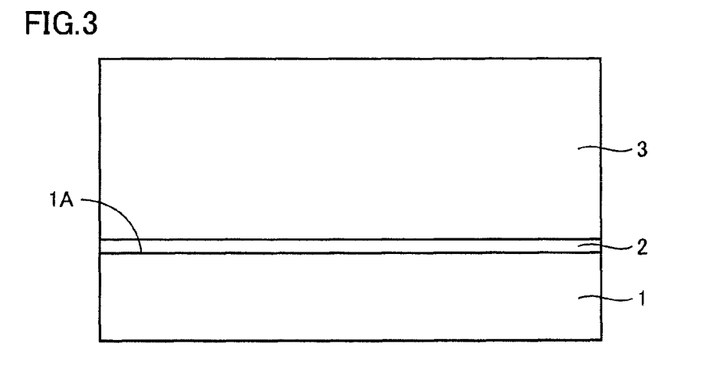
FIG. 3 is a schematic cross-sectional view for illustrating the method of manufacturing a MOSFET in the first embodiment.

One example of a method of manufacturing MOSFET 100 in the first embodiment will now be described with reference to FIGS. 2 to 7. Referring to FIG. 2, in the method of manufacturing MOSFET 100 in the present embodiment, initially in the step (S10), a silicon carbide substrate preparation step is performed. In this step (S10), referring to FIG. 3, for example, silicon carbide substrate 1 having a diameter not smaller than 6 inches and having main surface 1A of which off angle with respect to a {0001} plane is not smaller than 50° and not greater than 65° is prepared.

Then, in the step (S20), an epitaxial growth step is performed. In this step (S20), referring to FIG. 3, buffer layer 2 and drift layer 3 composed of silicon carbide are successively formed on one main surface 1A of silicon carbide substrate 1 through epitaxial growth.

Figure 4:
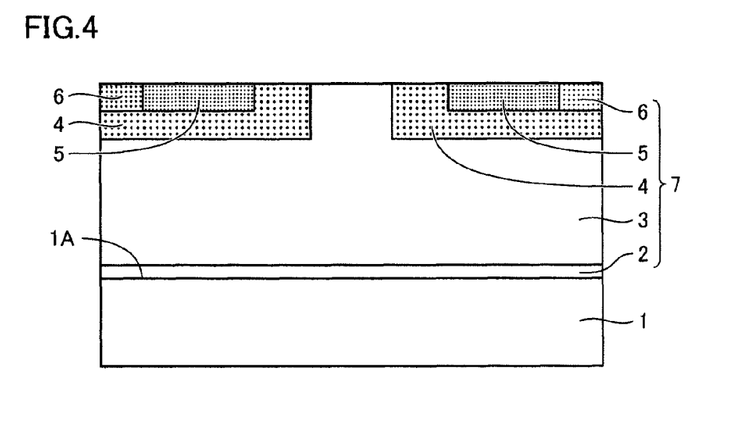
FIG. 4 is a schematic cross-sectional view for illustrating the method of manufacturing a MOSFET in the first embodiment.

Then, in the step (S30), an ion implantation step is performed. In this step (S30), referring to FIGS. 3 and 4, initially, ion implantation for forming p-type body region 4 is performed. Specifically, for example, by implanting Al (aluminum) ions into drift layer 3, p-type body region 4 is formed. Then, ion implantation for forming $n^+$ region 5 is performed. Specifically, for example, by implanting P (phosphorus) ions into p-type body region 4, $n^+$ region 5 is formed in p-type body region 4. Further, ion implantation for forming $p^+$ region 6 is performed. Specifically, for example, by implanting Al ions into p-type body region 4, $p^+$ region 6 is formed in p-type body region 4. Ion implantation above can be performed, for example, by forming on the main surface of drift layer 3, a mask layer composed of silicon dioxide ($SiO_2$) and having an opening in a desired region into which ions should be implanted. An opening in the mask layer can be formed, for example, with RIE.

Then, in the step (S40), an activation annealing step is performed. In this step (S40), for example, heat treatment in which heating to 1700° C. in an atmosphere of such an inert gas as argon is performed and held for 30 minutes is performed. Thus, an impurity implanted in the step (S30) above is activated. The steps (S20) to (S40) above implement an active layer formation step for forming active layer 7 on silicon carbide substrate 1.

Then, in the step (S50), a gate oxide film formation step is performed. In this step (S50), referring to FIGS. 4 and 5, for example, heat treatment in which heating to 1300° C. in an oxygen atmosphere is performed and held for 60 minutes is performed. Thus, oxide film (gate oxide film) 91 is formed.

Figure 5:
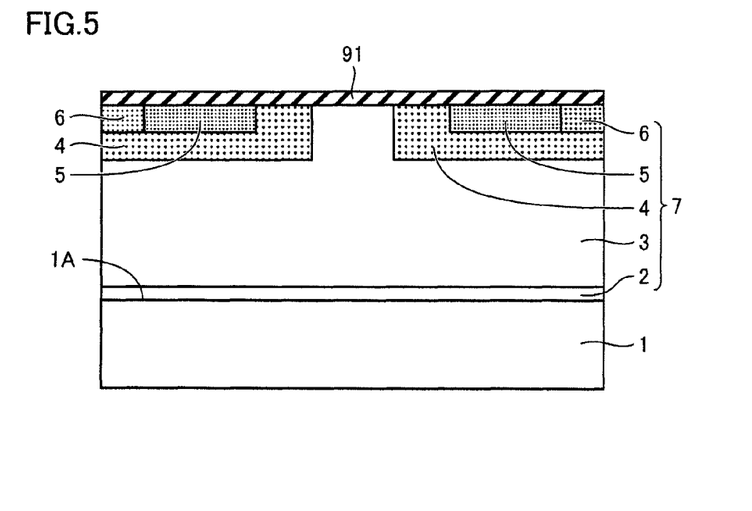
FIG. 5 is a schematic cross-sectional view for illustrating the method of manufacturing a MOSFET in the first embodiment.

Subsequent to this step (S50), an NO annealing step may be performed. In this NO annealing step, a nitric oxide (NO) gas is adopted as an atmospheric gas and heat treatment for heating in the atmospheric gas is performed. As a condition for this heat treatment, for example, a condition of holding for about 1 hour at a temperature not lower than 1100° C. and not higher than 1300° C. can be adopted. Through such heat treatment, nitrogen atoms are introduced in an interface region between oxide film 91 and drift layer 3. Thus, formation of an interface state in the interface region between oxide film 91 and drift layer 3 can be suppressed and channel mobility of MOSFET 100 that is finally obtained can be improved. It is noted that a process of using as an atmospheric gas, another gas capable of introducing nitrogen atoms into the interface region between oxide film 91 and drift layer 3 instead of the NO gas may be adopted.

In addition, in succession to the NO annealing step, an Ar annealing step is preferably performed. In this Ar annealing step, an argon (Ar) gas is adopted as an atmospheric gas and heat treatment for heating in the atmospheric gas is performed. As a condition for this heat treatment, for example, a condition of holding for about 1 hour at a temperature higher than the heating temperature in the NO annealing step above and lower than a melting point of oxide film 91 can be adopted. Through such heat treatment, formation of an interface state in the interface region between oxide film 91 and drift layer 3 can further be suppressed and channel mobility of MOSFET 100 that is finally obtained can be obtained. It is noted that a process of using as an atmospheric gas, another inert gas such as a nitrogen gas instead of the Ar gas may be adopted.

Figure 6:
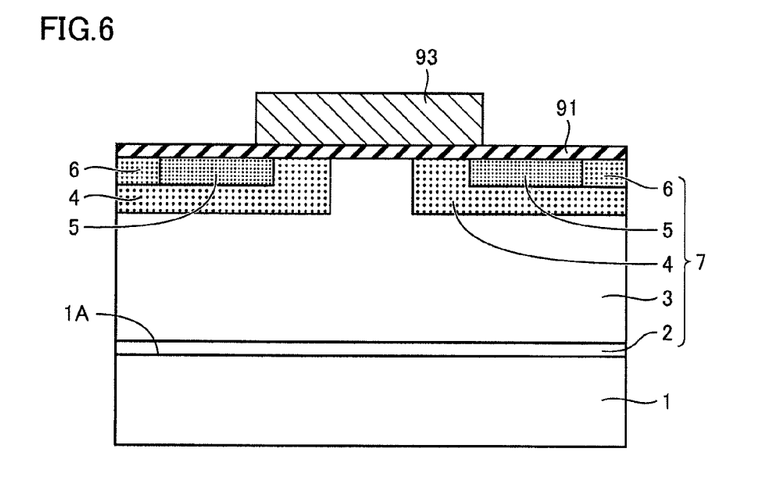
FIG. 6 is a schematic cross-sectional view for illustrating the method of manufacturing a MOSFET in the first embodiment.

Then, in the step (S60), a gate electrode formation step is performed. In this step (S60), referring to FIGS. 5 and 6, initially, a film of polysilicon which is a conductor to which an impurity has been added to high concentration is formed on oxide film 91, for example, with CVD (Chemical Vapor Deposition). Then, a mask layer is formed on the polysilicon film conforming to a desired shape of gate electrode 93, and for example, RIE is performed, to thereby form gate electrode 93.

Figure 7:
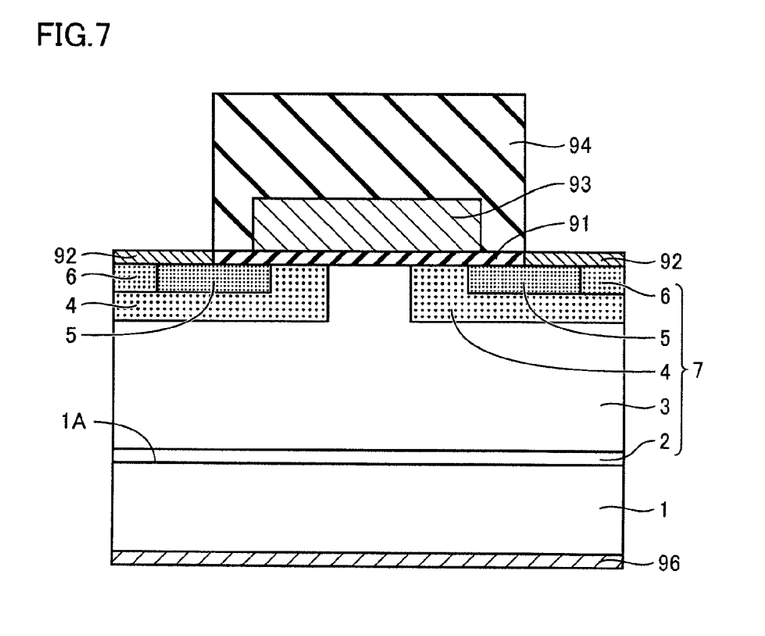
FIG. 7 is a schematic cross-sectional view for illustrating the method of manufacturing a MOSFET in the first embodiment.

Then, in the step (S70), a contact electrode formation step is performed. In this step (S70), referring to FIGS. 6 and 7, an insulating film made of such an insulator as silicon dioxide is formed, for example, with CVD, so as to cover gate electrode 93 and oxide film 91. Then, a mask layer conforming to a desired shape of source contact electrode 92 is formed on the insulating film. Then, for example, by performing RIE, the insulating film and oxide film 91 corresponding to a region where a source contact electrode is to be formed are removed. The insulating film thus left serves as interlayer insulating film 94. In addition, a nickel film is formed on a region from which the insulating film and oxide film 91 have been removed and on the main surface of silicon carbide substrate 1 opposite to buffer layer 2. Then, as this nickel film is heated and at least a part thereof is converted to silicide, source contact electrode 92 and drain electrode 96 are formed.

Referring next to FIG. 2, an interconnection formation step is performed. As the interconnection formation step, initially, in the step (S80), a conductor film formation step is performed. In this step (S80), referring to FIGS. 7 and 1, a conductor film made of such a conductor as aluminum is formed, for example, with vapor deposition. Then, in the step (S90), a conductor film processing step is performed. In this step (S90), a part of the conductor film formed in the step (S80) is etched away through RIE to thereby complete source interconnection 95.

Then, referring to FIG. 2, a passivation film formation step is performed. As the passivation film formation step, initially, in the step (S100), an insulator film formation step is performed. In this step (S100), referring to FIG. 1, an insulator film made of such an insulator as silicon dioxide is formed to cover source interconnection 95, for example, with CVD. Then, in the step (S110), an insulator film processing step is performed. In this step (S110), a part of the insulator film formed in the step (S100) is etched away through RIE, to thereby complete passivation film 97. It is noted that the interconnection formation step and the passivation film formation step may be performed in an interchanged order.

Then, referring to FIG. 2, in the step (S120), a leakage current lowering annealing step is performed. In this step (S120), annealing of heating silicon carbide substrate 1 to a temperature not lower than 50° C. is performed. More specifically, a structure obtained by performing the steps (S10) to (S110) above is heated to a temperature range not lower than 50° C. Thus, generation of a leakage current caused by RIE performed in the interconnection formation step and the passivation film formation step is suppressed. Through the procedure above, MOSFET 100 in the present embodiment is completed.

Here, for example, even in a case where RIE is performed in the step (S60) or (S70) above, for example, annealing for converting a nickel film to silicide is performed in the step (S70). Then, heating in this annealing suppresses generation of a leakage current caused by RIE performed in the step (S60) or (S70). After RIE is performed in the step (S90), however, naturally, annealing of heating to 50° C. or higher is not performed. Therefore, a leakage current may be generated by RIE performed in the step (S90) or the step (S110). Meanwhile, in the method of manufacturing MOSFET 100 in the present embodiment, the leakage current lowering annealing step is performed as the step (S120). Thus, generation of a leakage current caused by RIE performed in the step (S90) or the step (S110) is suppressed. Consequently, with the method of manufacturing MOSFET 100 in the present embodiment, MOSFET 100 in which generation of a leakage current is suppressed can be manufactured.

It is noted that the annealing temperature in the step (S120) above is preferably not higher than 400° C. Thus, for example, even in a case where an interconnection made of aluminum is formed in the interconnection formation step as described above, damage to the interconnection by annealing in the step (S120) can be suppressed.

In addition, in the method of manufacturing MOSFET 100 in the present embodiment, RIE is preferably not performed after the step (S120) above. Thus, a new cause of generation of a leakage current can be suppressed.

Moreover, annealing in the step (S120) may be performed in an inert gas. In a case where annealing is performed at a relatively low temperature, annealing is preferably performed in air from a point of view of costs. In a case where annealing is performed at a relatively high temperature, however, an inert gas is preferably adopted as an atmosphere from a point of view of reliable suppression of oxidation of MOSFET 100.

Second Embodiment

Figure 8:
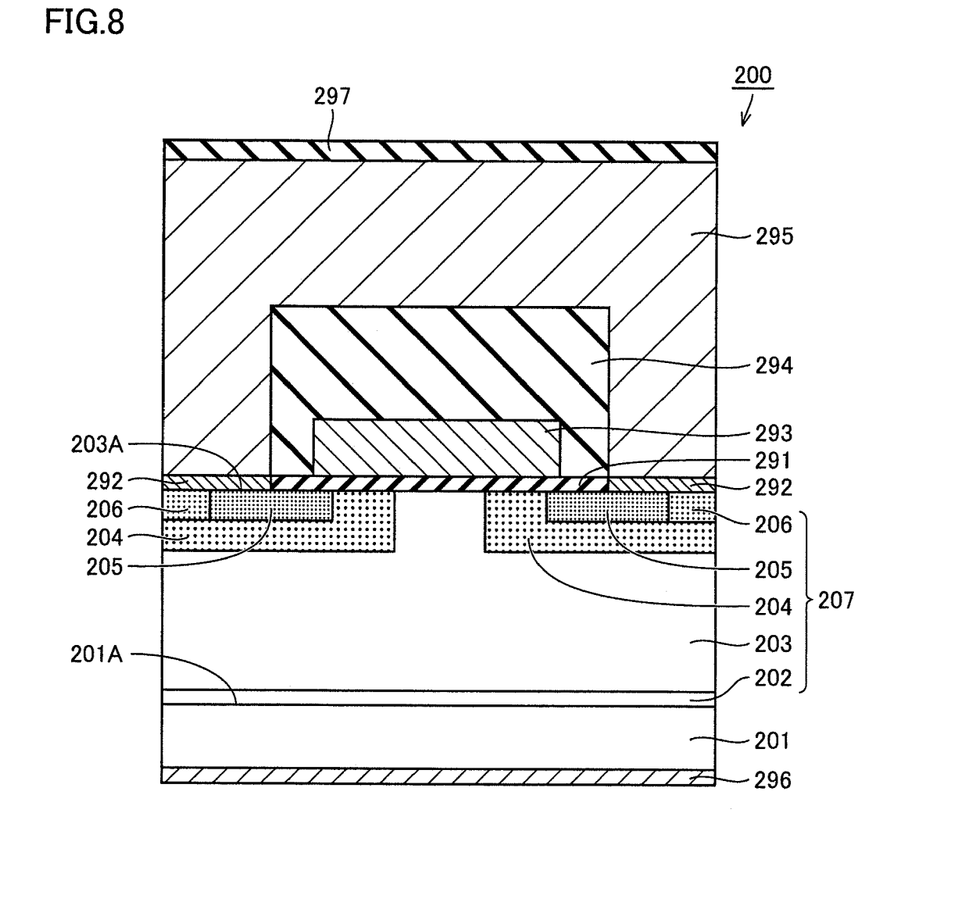
FIG. 8 is a schematic cross-sectional view showing a structure of an IGBT in a second embodiment.

A second embodiment representing another embodiment of the present invention will now be described. Referring to FIG. 8, an IGBT 200 representing a semiconductor device in the present embodiment includes a silicon carbide substrate 201 having the p conductivity type, a buffer layer 202 (which may have any of the n conductivity type and the p conductivity type), a drift layer 203 composed of silicon carbide and having the n conductivity type, a pair of p-type body regions 204 having the p conductivity type, an $n^+$ region 205 having the n conductivity type, and a $p^+$ region 206 having the p conductivity type.

Buffer layer 202 is formed on one main surface 201A of silicon carbide substrate 201 and includes an impurity at concentration higher than in drift layer 203. Drift layer 203 is formed on buffer layer 202 and has the n conductivity type by including an n-type impurity. Buffer layer 202 and drift layer 203 are epitaxial growth layers formed on one main surface 201A of silicon carbide substrate 201.

The pair of p-type body regions 204 is formed separately from each other in drift layer 203 so as to include a main surface 203A opposite to the main surface on the side of silicon carbide substrate 201, and it has the p conductivity type by including a p-type impurity. A p-type impurity included in p-type body region 204 is, for example, aluminum (Al), boron (B), or the like.

$N^+$ region 205 is formed in each of the pair of p-type body regions 204 so as to include main surface 203A above and to be surrounded by p-type body region 204. $N^+$ region 205 includes an n-type impurity such as P at concentration (density) higher than that of an n-type impurity included in drift layer 203. $P^+$ region 206 is formed in each of the pair of p-type body regions 204 so as to include main surface 203A above, to be surrounded by p-type body region 204, and to be adjacent to $n^+$ region 205. $P^+$ region 206 includes a p-type impurity such as Al at concentration (density) higher than that of a p-type impurity included in p-type body region 204. Buffer layer 202, drift layer 203, p-type body regions 204, $n^+$ region 205, and $p^+$ region 206 above form an active layer 207.

Referring further to FIG. 8, IGBT 200 includes a gate oxide film 291 serving as a gate insulating film, a gate electrode 293, a pair of emitter contact electrodes 292, an interlayer insulating film 294, an emitter interconnection 295, a collector electrode 296, and a passivation film 297.

Gate oxide film 291 is formed on main surface 203A to be in contact with main surface 203A and to extend from an upper surface of one $n^+$ region 205 to an upper surface of the other $n^+$ region 205, and composed, for example, of silicon dioxide ($SiO_2$).

Gate electrode 293 is arranged in contact with gate oxide film 291 so as to extend from one $n^+$ region 205 to the other $n^+$ region 205 over the same. In addition, gate electrode 293 is made of such a conductor as polysilicon to which an impurity has been added or Al.

Emitter contact electrode 292 is arranged to extend from each of the pair of $n^+$ regions 205 to $p^+$ region 206 and to be in contact with main surface 203A. In addition, emitter contact electrode 292 is made of a material capable of establishing ohmic contact with both of n$^+$ region 205 and p$^+$ region 206, such as nickel silicide.

Interlayer insulating film 294 is formed to surround gate electrode 293 on main surface 203A and to extend from one p-type body region 204 to the other p-type body region 204 over the same, and made, for example, of such an insulator as silicon dioxide (SiO$_2$).

Emitter interconnection 295 surrounds interlayer insulating film 294 on main surface 203A and it extends to an upper surface of emitter contact electrode 292. In addition, emitter interconnection 295 is made of such a conductor as Al and electrically connected to n$^+$ region 205 through emitter contact electrode 292.

Collector electrode 296 is formed in contact with a main surface of silicon carbide substrate 201 opposite to a side where drift layer 203 is formed. This collector electrode 296 is made of a material capable of establishing ohmic contact with silicon carbide substrate 201 such as nickel silicide, and electrically connected to silicon carbide substrate 201.

Passivation film 297 is formed to cover emitter interconnection 295 and made of such an insulator as silicon dioxide.

An operation of IGBT 200 will now be described. Referring to FIG. 8, when a voltage is applied to gate electrode 293 and the voltage exceeds a threshold value, an inversion layer is formed in p-type body region 204 in contact with gate oxide film 291 under gate electrode 293 and n$^+$ region 205 and drift layer 203 are electrically connected to each other. Thus, electrons are injected from n$^+$ region 205 to drift layer 203 and holes are accordingly supplied from silicon carbide substrate 201 through buffer layer 202 to drift layer 203. Consequently, IGBT 200 is turned on and conductivity modulation is caused in drift layer 203, so that a current flows while resistance between emitter contact electrode 292 and collector electrode 296 has been lowered. On the other hand, when the voltage above applied to gate electrode 293 is not higher than the threshold value, the inversion layer above is not formed and hence a reverse-biased state between drift layer 203 and p-type body region 204 is maintained. Consequently, IGBT 200 is turned off and no current flows.

Here, when no measures are taken against use of RIE in the process for manufacturing IGBT 200, a leakage current may be generated during the operation above and an unintended current may flow. IGBT 200 in the present embodiment, however, is manufactured with the method of manufacturing a semiconductor device in the present embodiment which will be described below, and therefore a leakage current is suppressed.

One example of a method of manufacturing IGBT 200 in the second embodiment will now be described with reference to FIGS. 9 to 14. The method of manufacturing IGBT 200 in the second embodiment can be performed basically similarly to the method of manufacturing MOSFET 100 in the first embodiment above. Specifically, referring to FIG. 9, in the method of manufacturing IGBT 200 in the present embodiment, initially in the step (S210), a silicon carbide substrate preparation step is performed. In this step (S210), referring to FIG. 10, for example, silicon carbide substrate 201 having main surface 201A of which off angle with respect to the {0001} plane is not smaller than 50° and not greater than 65° is prepared.

Then, in the step (S220), an epitaxial growth step is performed. In this step (S220), referring to FIG. 10, buffer layer 202 and drift layer 203 are successively formed on one main surface 201A of silicon carbide substrate 201 through epitaxial growth.

Figure 11:
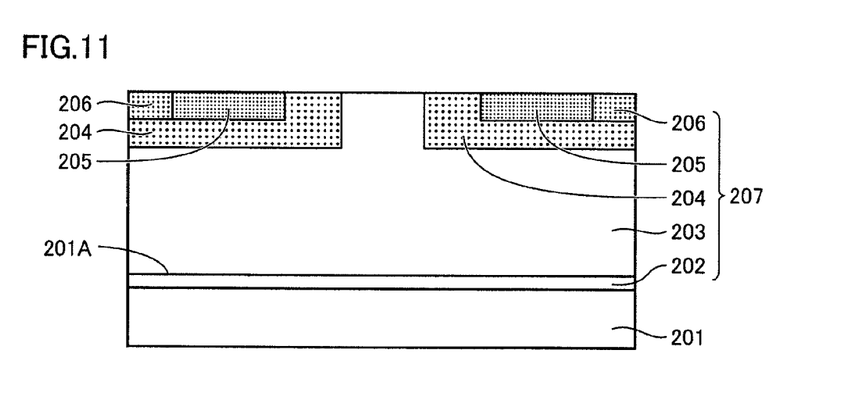
FIG. 11 is a schematic cross-sectional view for illustrating the method of manufacturing an IGBT in the second embodiment.

Then, in the step (S230), an ion implantation step is performed. In this step (S230), referring to FIGS. 10 and 11, initially, ion implantation for forming p-type body region 204 is performed. Specifically, for example, by implanting Al (aluminum) ions into drift layer 203, p-type body region 204 is formed. Then, ion implantation for forming n$^+$ region 205 is performed. Specifically, for example, by implanting P (phosphorus) ions into p-type body region 204, n+ region 205 is formed in p-type body region 204. Further, ion implantation for forming p$^+$ region 206 is performed. Specifically, for example, by implanting Al ions into p-type body region 204, p$^+$ region 206 is formed in p-type body region 204. Ion implantation above can be performed, for example, by forming on the main surface of drift layer 203, a mask layer composed of silicon dioxide (SiO$_2$) and having an opening in a desired region into which ions should be implanted.

Figure 9:
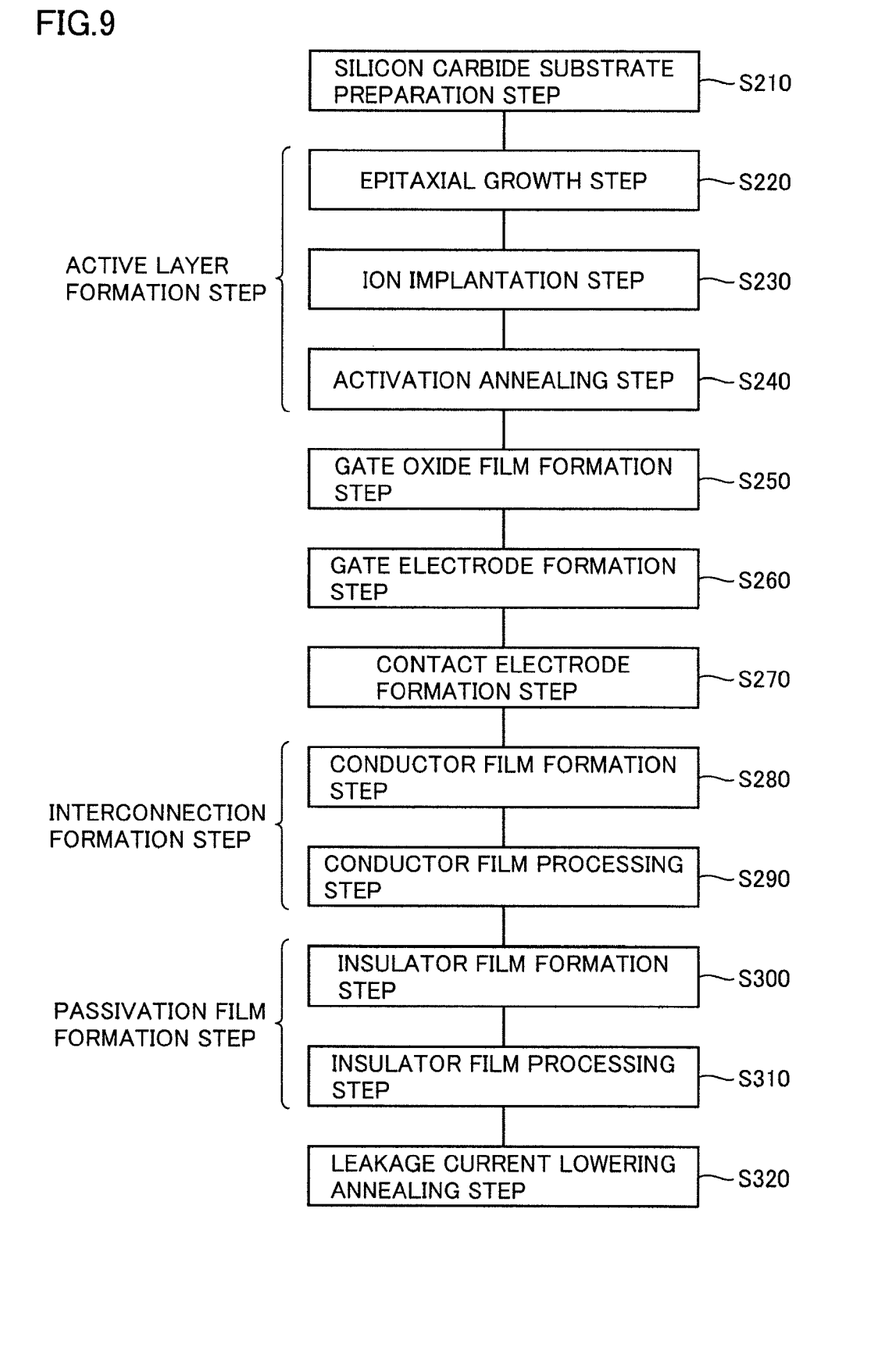
FIG. 9 is a flowchart showing outlines of a method of manufacturing an IGBT in the second embodiment.
Figure 10:
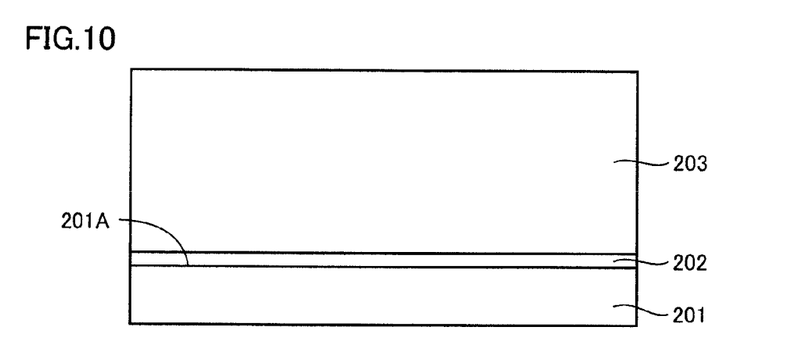
FIG. 10 is a schematic cross-sectional view for illustrating the method of manufacturing an IGBT in the second embodiment.

Then, in the step (S240), an activation annealing step is performed. In this step (S240), for example, heat treatment in which heating to 1700° C. in an atmosphere of such an inert gas as argon is performed and held for 30 minutes is performed. Thus, an impurity implanted in the step (S230) above is activated.

Figure 12:
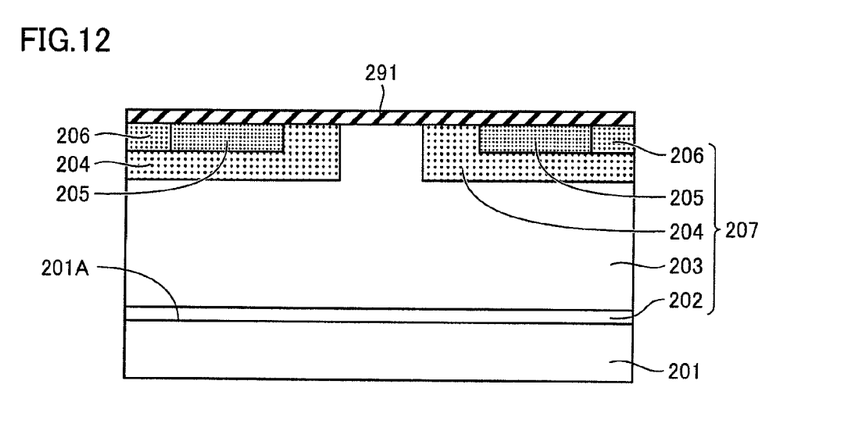
FIG. 12 is a schematic cross-sectional view for illustrating the method of manufacturing an IGBT in the second embodiment.

Then, in the step (S250), a gate oxide film formation step is performed. In this step (S250), referring to FIGS. 11 and 12, for example, heat treatment in which heating to 1300° C. in an oxygen atmosphere is performed and held for 60 minutes is performed. Thus, oxide film (gate oxide film) 291 is formed.

Subsequent to this step (S250), an NO annealing step and an Ar annealing step may be performed. These NO annealing step and Ar annealing step can be performed as in the first embodiment.

Figure 13:
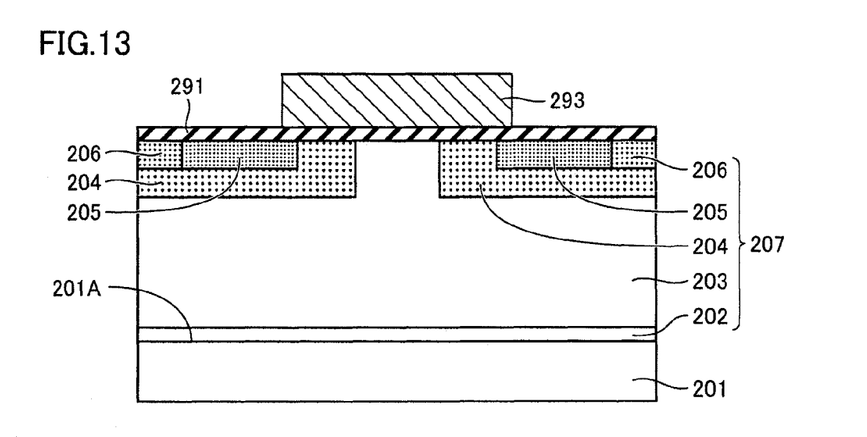
FIG. 13 is a schematic cross-sectional view for illustrating the method of manufacturing an IGBT in the second embodiment.

Then, in the step (S260), a gate electrode formation step is performed. In this step (S260), referring to FIGS. 12 and 13, as in the step (S60) in the first embodiment above, a film of polysilicon is formed on oxide film 291, for example, with CVD, and for example, RIE is performed, to thereby form gate electrode 293.

Figure 14:
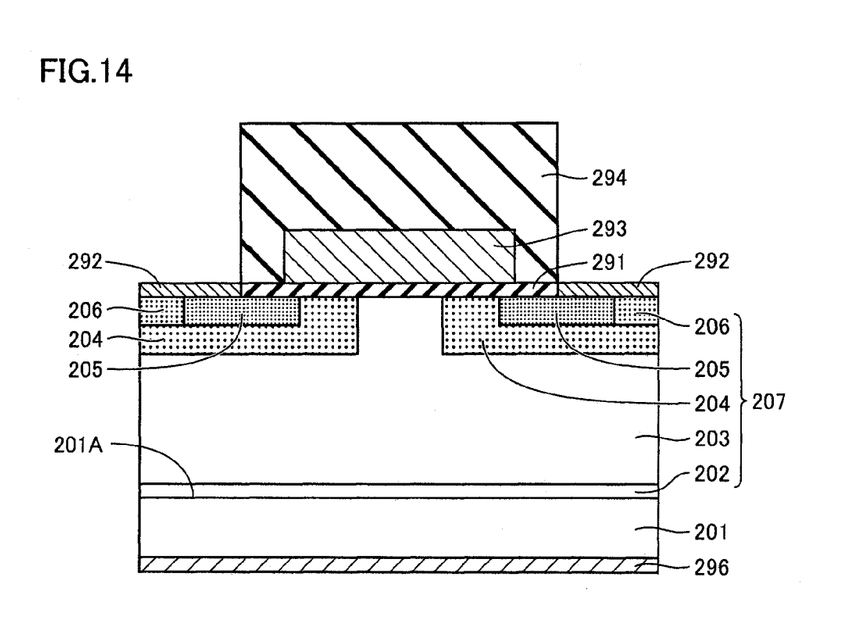
FIG. 14 is a schematic cross-sectional view for illustrating the method of manufacturing an IGBT in the second embodiment.

Then, in the step (S270), a contact electrode formation step is performed. In this step (S270), referring to FIGS. 13 and 14, as in the step (S70) in the first embodiment above, an insulating film is formed, for example, with CVD, and then RIE is performed so that the insulating film and oxide film 291 corresponding to a region where an emitter contact electrode is to be formed are removed and interlayer insulating film 294 is formed. Then, a nickel film is formed on a region from which the insulating film and oxide film 291 have been removed and on the main surface of silicon carbide substrate 201 opposite to buffer layer 202, and annealing for converting at least a part thereof into silicide is performed, to thereby form emitter contact electrode 292 and collector electrode 296.

Referring next to FIG. 9, an interconnection formation step and a passivation film formation step are performed. As the interconnection formation step, initially, a conductor film formation step is performed in the step (S280) and thereafter a conductor film processing step is performed in the step (S290). These steps (S280) and (S290) can be performed similarly to the steps (S80) and (S90) in the first embodiment. In addition, as the passivation film formation step, initially, an insulator film formation step is performed in the step (S300) and thereafter an insulator film processing step is performed in the step (S310). These steps (S300) and (S310) are performed similarly to the steps (S100) and (S110) in the first embodiment.

Then, referring to FIG. 9, in the step (S320), a leakage current lowering annealing step is performed. In this step (S320), as in the step (S120) in the first embodiment above, annealing of heating silicon carbide substrate 201 to a temperature not lower than 50° C. is performed. Thus, generation of a leakage current caused by RIE performed in the interconnection formation step and the passivation film formation step is suppressed. Through the procedure above, IGBT 200 in the present embodiment is completed.

Here, in the method of manufacturing IGBT 200 in the present embodiment, the leakage current lowering annealing step is performed as the step (S320). Thus, generation of a leakage current caused by RIE performed in the step (S290) or the step (S310) is suppressed. Consequently, with the method of manufacturing IGBT 200 in the present embodiment, IGBT 200 in which generation of a leakage current is suppressed can be manufactured.

Example

An experiment for confirming an effect of lowering in leakage current by performing annealing after RIE was conducted. A procedure in the experiment is as follows.

Initially, an experiment sample was fabricated in the following procedure. An n-type silicon carbide substrate was prepared and an oxide film to serve as a gate oxide film was formed by subjecting one main surface of the silicon carbide substrate to thermal oxidation. Then, an aluminum film and a resist film were successively formed on the oxide film. Then, a mask layer was prepared by forming an opening in the resist film with photolithography and a part of the aluminum film was removed through RIE with the use of the mask layer, to thereby expose a part of the oxide film above. The aluminum film left here corresponds to the gate electrode. Thereafter, by removing the mask layer (a resist layer), a MOS capacitor for experiment was obtained. Then, the obtained MOS capacitor was subjected to annealing of heating in a temperature range from 25° C. to 100° C., to thereby prepare an experiment sample.

Then, a voltage corresponding to a gate voltage was applied across the silicon carbide substrate and the aluminum film in the experiment sample above and a current was measured. This current corresponds to a leakage current.

Figure 15:
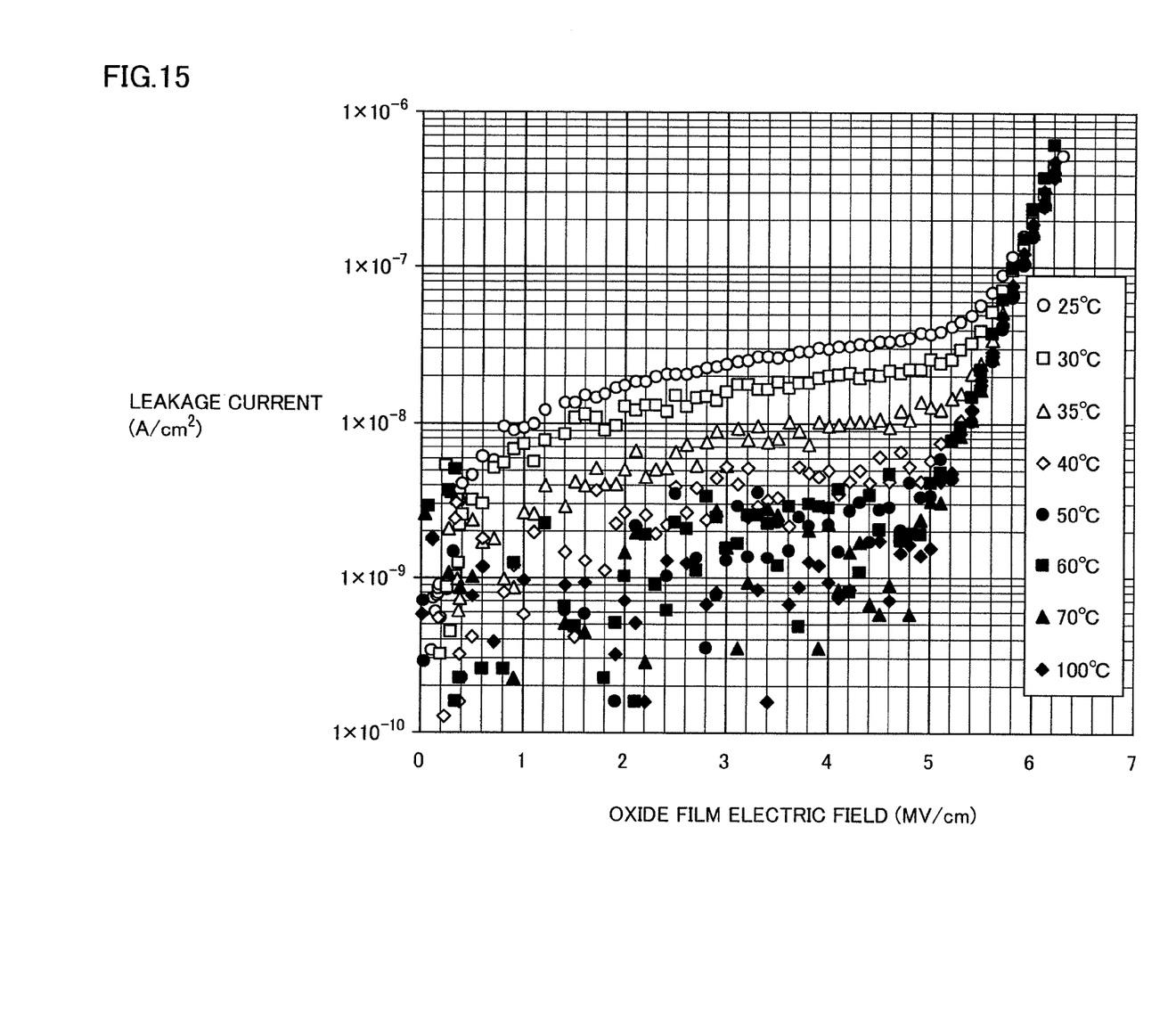
FIG. 15 is a diagram showing relation between oxide film electric field and a leakage current at each annealing temperature.
Figure 16:
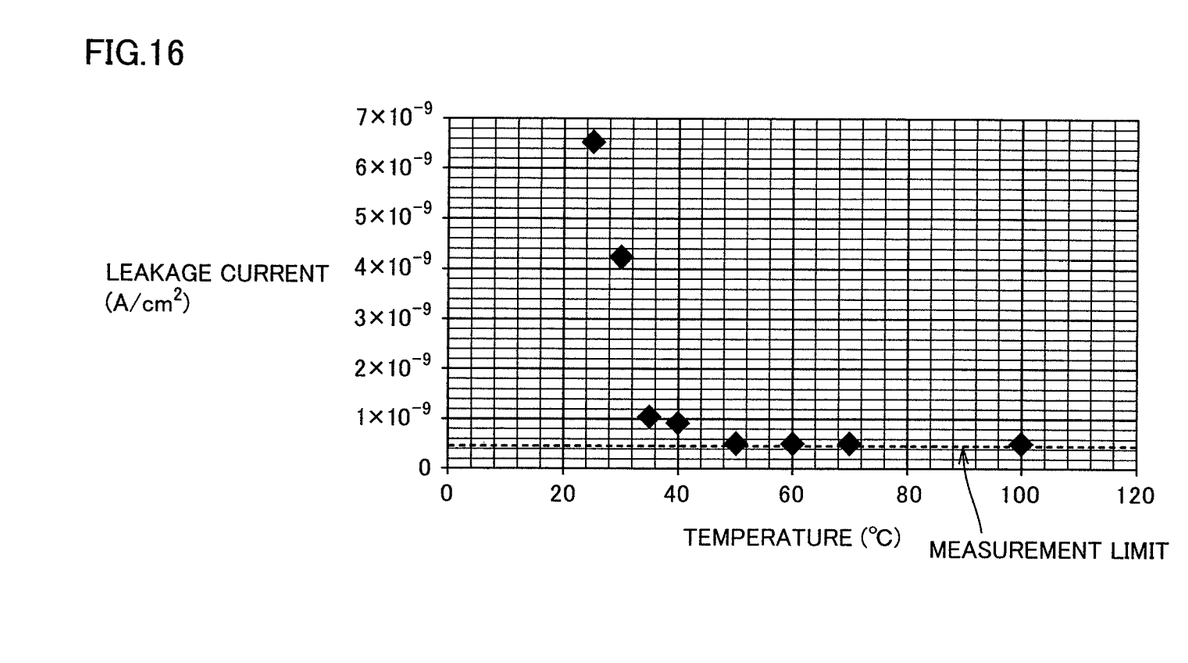
FIG. 16 is a diagram showing relation between an annealing temperature and a leakage current in a case where oxide film electric field is set to 3 MV/cm.
Figure 17:
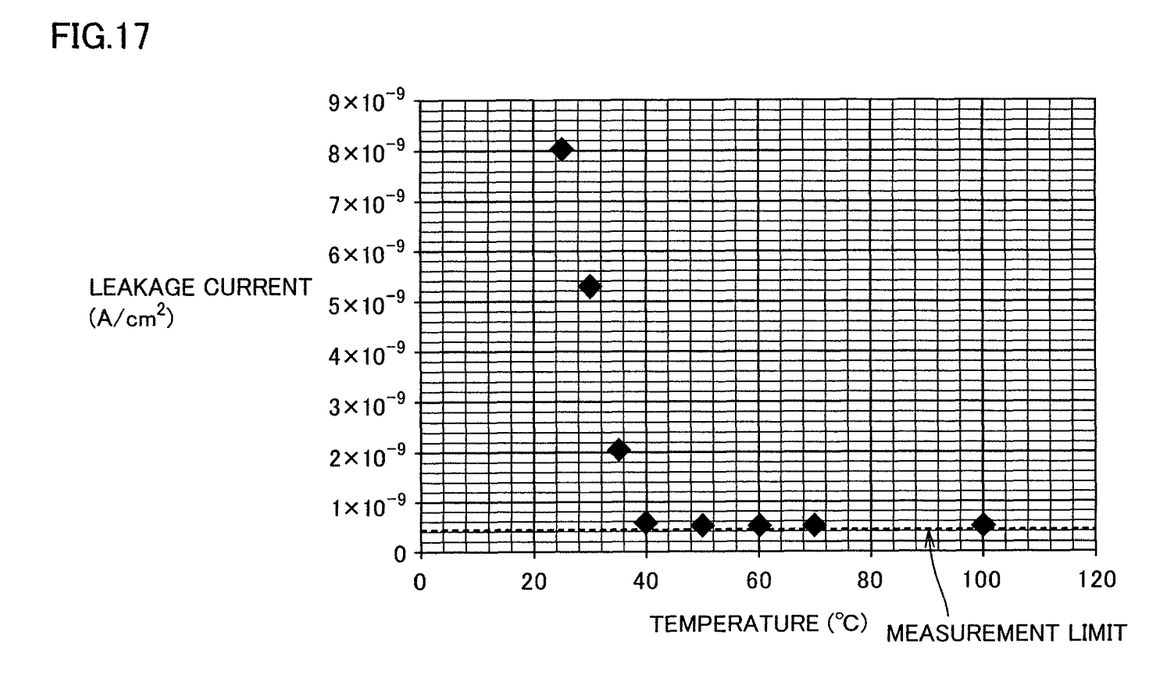
FIG. 17 is a diagram showing relation between an annealing temperature and a leakage current in a case where oxide film electric field is set to 4 MV/cm.

An experimental result will be described with reference to FIGS. 15 to 17. In FIG. 15, the abscissa represents electric field applied to the oxide film between the silicon carbide substrate and the aluminum film and the ordinate represents a measured leakage current. FIG. 15 shows results corresponding to experiment samples fabricated with annealing temperatures of 25° C., 30° C., 35° C., 40° C., 50° C., 60° C., 70° C., and 100° C. being set, respectively. In addition, in FIGS. 16 and 17, the abscissa represents an annealing temperature and the ordinate represents a leakage current. It is noted that FIGS. 16 and 17 show respective cases where electric field applied to the oxide film is set to 3 MV/cm and 4 MV/cm. This electric field at 3 to 4 MV/cm corresponds to electric field applied to a gate oxide film in a general MOSFET. In addition, a dashed line in FIGS. 16 and 17 shows a measurement limit of a leakage current.

An experiment result will now be described. Referring to FIG. 15, as the annealing temperature is higher, a value for a leakage current is smaller. Referring then to FIGS. 16 and 17, in a range of a gate voltage normally employed, a leakage current is lowered to a measurement limit by setting the annealing temperature to 50° C. or higher.

It was confirmed based on the experimental result above that a leakage current resulting from RIE could sufficiently be suppressed by annealing at 50° C. or higher.

It should be understood that the embodiments and the example disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The method of manufacturing a semiconductor device according to the present invention is particularly advantageously applicable to manufacturing of a semiconductor device required to achieve lowering in leakage current.

REFERENCE SIGNS LIST 1, 201 silicon carbide substrate; 1A, 201A main surface; 2, 202 buffer layer; 3, 203 drift layer; 3A, 203A main surface; 4, 204 p-type body region; 5, 205 $n^+$ region; 6, 206 $p^+$ region; 7, 207 active layer; 91, 291 gate oxide film (oxide film); 92 source contact electrode; 93, 293 gate electrode; 94, 294 interlayer insulating film; 95 source interconnection; 96 drain electrode; 97, 297 passivation film; 100 MOSFET; 200 IGBT; 292 emitter contact electrode; 295 emitter interconnection; and 296 collector electrode.

The invention claimed is:

1. A method of manufacturing a semiconductor device, comprising the steps of:
 preparing a substrate composed of silicon carbide;
 forming an active layer on said substrate;
 forming a gate insulating film on said active layer;
 forming a gate electrode on said gate insulating film;
 forming a contact electrode on said active layer, in contact with said active layer;
 forming an interconnection on said contact electrode, in contact with said contact electrode,
 said step of forming an interconnection including the steps of
  forming a conductor film on said contact electrode, and
  processing said conductor film by etching said conductor film with reactive ion etching;
 forming a passivation film to cover said conductor film; and
 performing annealing or heating said substrate to a temperature not lower than 50° C. to lower a leakage current after the step of processing said conductor film, wherein said step of annealing or heating said substrate is performed after said step of forming said passivation film.

2. The method of manufacturing a semiconductor device according to claim 1, wherein
 in said step of performing annealing, said substrate is heated to a temperature not higher than 400° C.

3. The method of manufacturing a semiconductor device according to claim 1, wherein
 reactive ion etching is not performed after said step of performing annealing.

4. The method of manufacturing a semiconductor device according to claim 1, wherein
 said annealing is performed in an inert gas.

* * * * *